(12) United States Patent
Wang et al.

(10) Patent No.: US 11,735,605 B2
(45) Date of Patent: Aug. 22, 2023

(54) DISPLAY SUBSTRATE AND METHOD FOR MANUFACTURING THE SAME, AND DISPLAY APPARATUS

(71) Applicant: BOE TECHNOLOGY GROUP CO., LTD., Beijing (CN)

(72) Inventors: Bo Wang, Beijing (CN); Hao Zhang, Beijing (CN); Fuqiang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 429 days.

(21) Appl. No.: 17/042,847

(22) PCT Filed: Nov. 12, 2019

(86) PCT No.: PCT/CN2019/117460
§ 371 (c)(1),
(2) Date: Sep. 28, 2020

(87) PCT Pub. No.: WO2021/092752
PCT Pub. Date: May 20, 2021

(65) Prior Publication Data
US 2021/0305282 A1 Sep. 30, 2021

(51) Int. Cl.
*H01L 27/14* (2006.01)
*H01L 27/12* (2006.01)

(52) U.S. Cl.
CPC ........ *H01L 27/127* (2013.01); *H01L 27/1251* (2013.01); *H01L 27/1255* (2013.01)

(58) Field of Classification Search
CPC .............. H01L 27/127; H01L 27/1251; H01L 27/1255; H01L 27/32; G09F 9/30

USPC .............................................. 257/71, 72, 59
See application file for complete search history.

(56) References Cited

U.S. PATENT DOCUMENTS

| 10,756,136 B1 | 8/2020 | Ma et al. |
| 2016/0188061 A1 | 6/2016 | Cho et al. |
| 2020/0227488 A1 | 7/2020 | Xin et al. |

FOREIGN PATENT DOCUMENTS

| CN | 103560114 A | | 2/2014 |
| CN | 109755282 A | | 5/2019 |
| CN | 110061014 A | | 7/2019 |
| CN | 110392146 A | * | 8/2019 |
| CN | 110112160 A | * | 10/2019 |

* cited by examiner

*Primary Examiner* — Tan N Tran
(74) *Attorney, Agent, or Firm* — Procopio, Cory, Hargreaves & Savitch LLP

(57) ABSTRACT

A display substrate has a main display area and at least one auxiliary display area located beside the main display area. The display substrate includes a plurality of first sub-pixels located in the main display area, and a plurality of second sub-pixels located in each of the at least one auxiliary display area. A distribution density of the plurality of first sub-pixels in the main display area is greater than a distribution density of the plurality of second sub-pixels in each auxiliary display area. Each of the plurality of second sub-pixels includes a pixel driving circuit, and the pixel driving circuit includes at least one vertical thin film transistor. A space exists between every two adjacent pixel driving circuits, and a plurality of spaces constitute a light-transmitting region of the corresponding auxiliary display area.

11 Claims, 6 Drawing Sheets

DISPLAY SUBSTRATE AND METHOD FOR MANUFACTURING THE SAME, AND DISPLAY APPARATUS

CROSS-REFERENCE TO RELATED APPLICATION

This application is a national phase entry under 35 USC 371 of International Patent Application No. PCT/CN2019/117460 filed on Nov. 12, 2019, which is incorporated herein by reference in its entirety.

TECHNICAL FIELD

The present disclosure relates to the field of display technologies, and in particular, to a display substrate and a method for manufacturing the same, and a display apparatus.

BACKGROUND

With the continuous development of science and technology, users have an increasing pursuit for the screen-to-body ratio of the display device (i.e., the ratio of the area of the display screen to the area of the front panel of the display device).

SUMMARY

In one aspect, a display substrate is provided. The display substrate has a main display area and at least one auxiliary display area located beside the main display area. The display substrate includes a plurality of first sub-pixels located in the main display area, and a plurality of second sub-pixels located in each of the at least one auxiliary display area. A distribution density of the plurality of first sub-pixels in the main display area is greater than a distribution density of the plurality of second sub-pixels in each auxiliary display area. Each of the plurality of second sub-pixels includes a pixel driving circuit, and the pixel driving circuit includes at least one vertical thin film transistor. A space exists between every two adjacent pixel driving circuits, and a plurality of spaces constitute a light-transmitting region of the corresponding auxiliary display area.

In some embodiments, each of the at least one vertical thin film transistor includes a first electrode, a vertical active layer and a second electrode that are sequentially stacked on top of one another, and a gate arranged corresponding to the vertical active layer.

In some embodiments, at least a portion of a side of the second electrode away from the first electrode is in contact with the gate.

In some embodiments, the pixel driving circuit further includes at least one capacitor. Each of the at least one capacitor includes a first electrode plate, a second electrode plate and a third electrode plate that are arranged in parallel in a direction from the first electrode to the second electrode. The first electrode plate is electrically connected to the third electrode plate. The first electrode plate is arranged in a same layer as the gate in the pixel driving circuit to which the first electrode plate belongs.

In some embodiments, the pixel driving circuit further includes at least one capacitor. Each of the at least one capacitor includes a first electrode plate, a second electrode plate and a third electrode plate that are arranged in parallel in a direction from the first electrode to the second electrode. The first electrode plate is electrically connected to the third electrode plate. The first electrode plate is arranged in a same layer as the first electrode in the pixel driving circuit to which the first electrode plate belongs. The second electrode plate is arranged in a same layer as the gate in the pixel driving circuit to which the second electrode plate belongs.

In some embodiments, the pixel driving circuit further includes at least one capacitor. Each of the at least one capacitor includes a first electrode plate, a second electrode plate and a third electrode plate that are arranged in parallel in a direction from the first electrode to the second electrode. The first electrode plate is electrically connected to the third electrode plate. The first electrode plate is arranged in a same layer as the second electrode in the pixel driving circuit to which the first electrode plate belongs. The second electrode plate is arranged in a same layer as the gate in the pixel driving circuit to which the second electrode plate belongs.

In some embodiments, each second sub-pixel further includes a pixel electrode electrically connected to the pixel driving circuit. The pixel electrode is arranged in a same layer as the third electrode plate.

In some embodiments, one of the at least one vertical thin film transistor is a driving transistor.

In some embodiments, the vertical active layer of the driving transistor has a first vertical conductive channel. A width of the first vertical conductive channel ranges from 3.0 µm to 4.5 µm, a length of the first vertical conductive channel ranges from 10 µm to 35 µm, and a width-to-length ratio of the first vertical conductive channel ranges from 0.09 to 0.45.

In some embodiments, the vertical active layer of each of the at least one vertical thin film transistor in addition to the driving transistor has a second vertical conductive channel. A width of the second vertical conductive channel ranges from 2.0 µm to 4.0 µm, a length of the second vertical conductive channel ranges from 2.0 µm to 4.0 µm, and a width-to-length ratio of the second vertical conductive channel ranges from 0.5 to 2.

In another aspect, a method for manufacturing a display substrate is provided. The display substrate has a main display area and at least one auxiliary display area located beside the main display area. The method for manufacturing the display substrate includes: providing a base; forming a plurality of horizontal thin film transistors and at least one vertical thin film transistor on a side of the base. Each of the at least one auxiliary display area is provided with the at least one vertical thin film transistor.

In some embodiments, forming a plurality of horizontal thin film transistors and at least one vertical thin film transistor on a side of the base, includes: forming at least one first electrode on a side of a portion of the base located in each auxiliary display area; forming a polysilicon film on a side of the at least one first electrode away from the base, patterning the polysilicon film to form a plurality of polysilicon layers; and doping the plurality of polysilicon layers to form a plurality of horizontal active layers and at least one vertical active layer. The plurality of horizontal active layers and the at least one vertical active layer are formed in a single doping process.

In some embodiments, forming at least one vertical thin film transistor, further includes: forming a second electrode on a side of each of the at least one vertical active layer away from the base; forming a metal film on a side of the second electrode away from the base, and patterning the metal film to form a gate. The gate is arranged corresponding to the corresponding vertical active layer.

In some embodiments, the method for manufacturing the display substrate further includes: forming at least one capacitor in each auxiliary display area. Each of the at least one capacitor includes a first electrode plate, a second electrode plate and a third electrode plate that are arranged in parallel in a direction from each of the at least one first electrode to the corresponding second electrode. The first electrode plate is electrically connected to the third electrode plate. Forming a metal film on a side of the second electrode away from the base, and patterning the metal film to form a gate, further includes: forming at least one first electrode plate. Or, the forming at least one first electrode on a side of a portion of the base located in each auxiliary display area, further includes: forming at least one first electrode plate; and forming a metal film on a side of the second electrode away from the base, and patterning the metal film to form a gate, further includes: forming at least one second electrode plate. Or, forming a second electrode on a side of each of the at least one vertical active layer away from the base, further includes: forming at least one first electrode plate; and forming a metal film on a side of the second electrode away from the base, and patterning the metal film to form a gate, further includes: forming at least one second electrode plate.

In yet another aspect, a display apparatus is provided. The display apparatus includes the display substrate in some embodiments as described above.

In some embodiments, the display apparatus further includes at least one optical device. Each of the at least one optical device corresponds to the light-transmitting region of one auxiliary display area of the display substrate. Each optical device is able to collect light passing through the corresponding light-transmitting region, or light emitted from each optical device is able to pass through the corresponding light-transmitting region.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to these drawings.

DETAILED DESCRIPTION

Some embodiments of the present disclosure will be described in combination with the accompanying drawings. Obviously, the described embodiments are merely some but not all of the embodiments of the present disclosure. All other embodiments obtained on the basis of the embodiments of the present disclosure by a person of ordinary skill in the art shall be included in the protection scope of the present disclosure.

Figure 11:
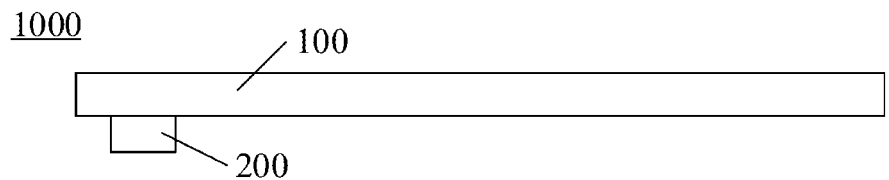
FIG. 11 is a schematic diagram showing a structure of a display apparatus, according to some embodiments of the present disclosure.
Figure 12:
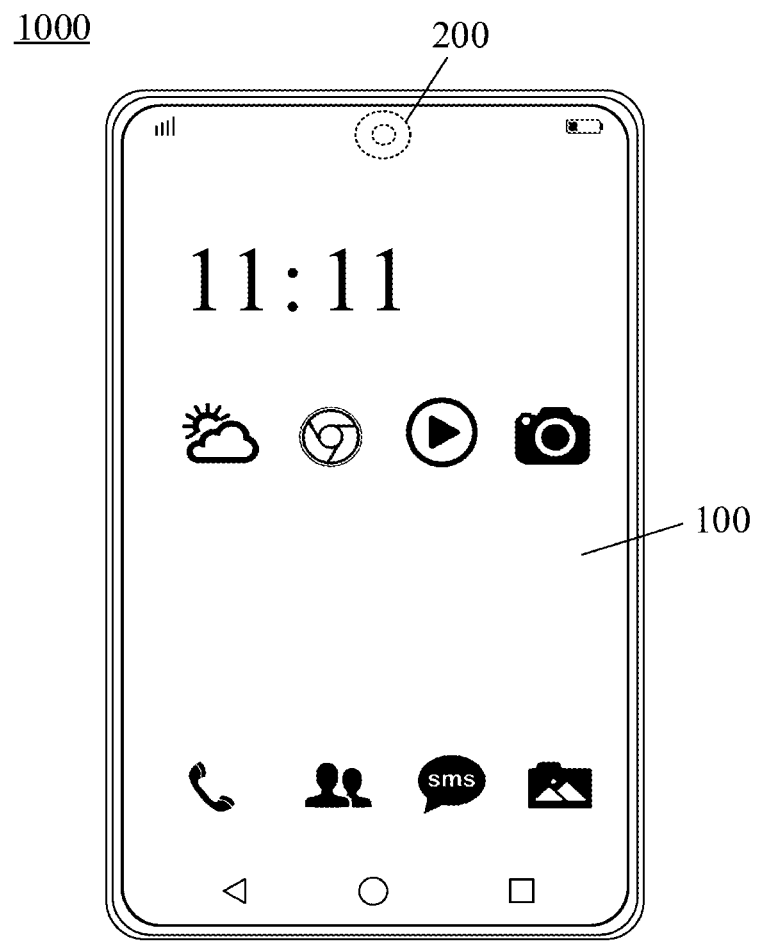
FIG. 12 is a schematic diagram showing a structure of another display apparatus, according to some embodiments of the present disclosure.

Referring to FIGS. 11 and 12, some embodiments of the present disclosure provide a display apparatus 1000. The display apparatus 1000 includes a display substrate 100 and at least one optical device 200.

A type of each of the at least one optical device 200 is various. In some examples, each optical device 200 includes a photosensitive device. For example, the photosensitive device includes a camera, an infrared receiver, and the like. In some other examples, each optical device 200 includes a light-emitting device. For example, the light-emitting device includes an infrared emitter.

Figure 1:
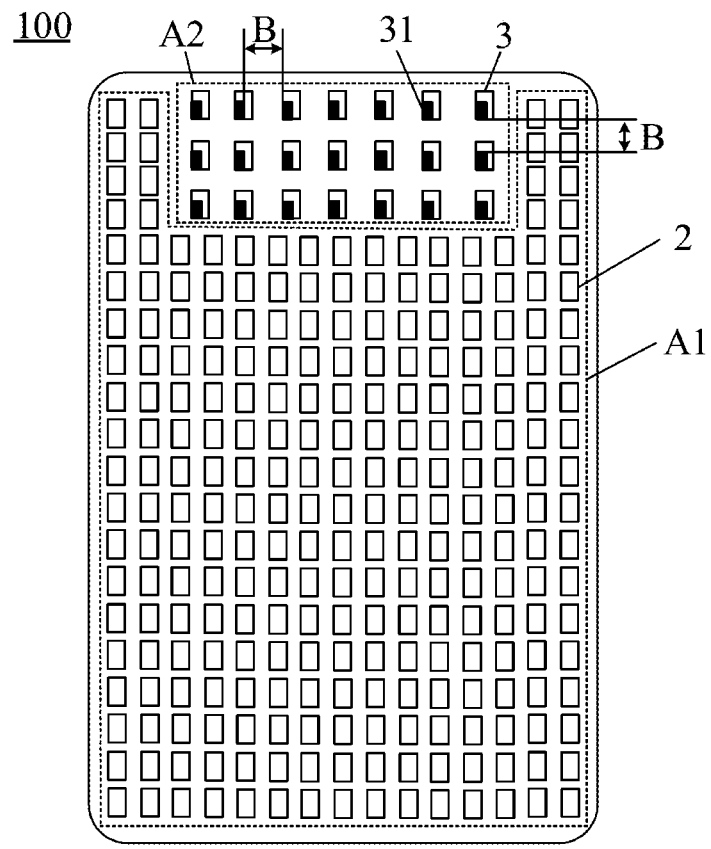
FIG. 1 is a schematic diagram showing a structure of a display substrate, according to some embodiments of the present disclosure.

Referring to FIG. 1, the display substrate 100 has a display area including a main display area A1 and at least one auxiliary display area A2 located beside the main display area A1.

The display substrate 100 includes a base 1 and a plurality of sub-pixels provided at a side of the base 1. The plurality of sub-pixels may block light to prevent the light from passing through the display substrate 100 through the plurality of sub-pixels. Herein, each of the plurality of sub-pixels is a sub-pixel of a single color. For example, each sub-pixel is a red sub-pixel, a blue sub-pixel, or a green sub-pixel.

The plurality of sub-pixels include a plurality of first sub-pixels 2 located in the main display area A1, and a plurality of second sub-pixels 3 located in each of the at least one auxiliary display area A2. A distribution density of the plurality of first sub-pixels 2 in the main display area A1 is greater than a distribution density of the plurality of second sub-pixels 3 in each auxiliary display area A2.

Herein, the plurality of first sub-pixels 2 and the plurality of second sub-pixels 3 are able to cooperate with each other to conjointly display image(s) that are required to be displayed on the display substrate 100. Moreover, the distribution density of the plurality of second sub-pixels 3 located in each auxiliary display area A2 is low, which may reduce the shielding effect on light, so that light is able to pass through each auxiliary display area A2.

The display substrate 100 has a display side for displaying images, and a non-display side opposite to the display side. Each optical device 200 is disposed on the non-display side of the display substrate 100, and corresponds to one of the at least one auxiliary display area A2. In this way, an occupied area of the optical device 200 on the display side of the display apparatus 1000 may be reduced, and a screen-to-body ratio of the display apparatus 1000 may be improved. Moreover, light at the display side of the display substrate 100 is able to enter the corresponding optical device 200 from each auxiliary display area A2. Alternatively, light emitted from each optical device 200 is able to travel to the display side of the display substrate 100 through the corresponding auxiliary display area A2. Therefore, the normal use of each optical device 200 is realized.

Herein, the type of the display apparatus 1000 is various. For example, the display apparatus, the type of which may be various, includes an organic light-emitting diode (OLED) display apparatus, a mini light-emitting diode (Mini LED) display apparatus, a micro light-emitting diode (Micro LED) display apparatus, a liquid crystal display (LCD) apparatus, and the like.

In some embodiments, in each auxiliary display area A2 of the display substrate 100, each of the plurality of second sub-pixels 3 includes a pixel driving circuit 31. The pixel driving circuit 31 includes at least one vertical thin film transistor 311. There is a space B between every two adjacent pixel driving circuits 31. The space B includes a space in a row direction of the plurality of second sub-pixels 3 or a space in a column direction of the plurality of second sub-pixels 3. A plurality of spaces B constitute a light-transmitting region of the corresponding auxiliary display area A2. That is, in each auxiliary display area A2, the region other than regions occupied by the second sub-pixels is the light-transmitting region of the corresponding auxiliary display area A2.

The pixel driving circuit 31 includes a plurality of thin film transistors and at least one storage capacitor. The plurality of thin film transistors include one driving transistor and at least one switching transistor.

In some examples, the pixel driving circuit 31 includes various structures, for example, "6T1C", "7T1C", "6T2C", "7T2C" and other structures. Herein, "T" represents a thin film transistor, and the number in front of "T" represents the number of the thin film transistors; "C" represents a storage capacitor, and the number in front of "C" represents the number of the storage capacitors.

Figure 2:
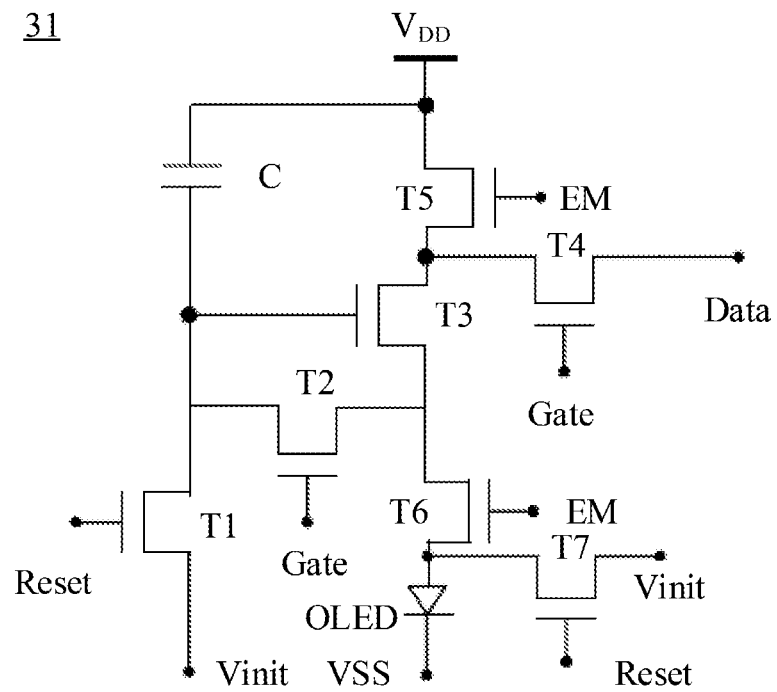
FIG. 2 is a schematic diagram of a pixel driving circuit, according to some embodiments of the present disclosure.

For example, referring to FIG. 2, the display substrate 100 is applied to the OLED display apparatus, and the pixel driving circuit 31 adopts the "7T1C" structure. That is, the pixel driving circuit 31 includes seven thin film transistors (T1 to T7) and one storage capacitor (C), and T3 is the driving transistor.

Figure 3:
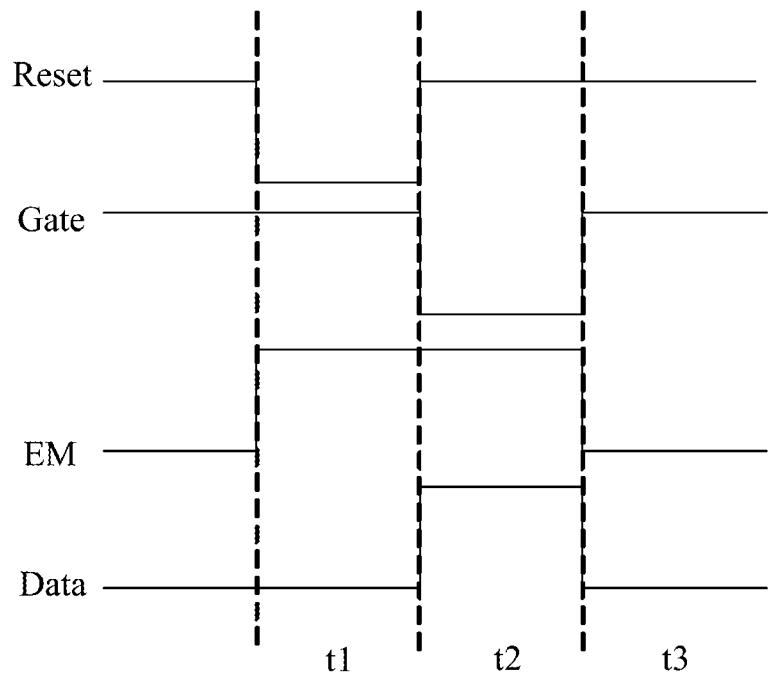
FIG. 3 is a timing diagram showing an operation of a pixel driving circuit, according to some embodiments of the present disclosure.

Referring to FIGS. 2 and 3, an operating process of the pixel driving circuit 31 will be exemplarily described below.

A duty cycle of the pixel driving circuit 31 includes a reset phase t1, a charging phase t2, and a light-emitting phase t3.

In the reset phase t1, a reset signal Reset is at low level, a scan signal Gate is at high level, an enable signal EM is at high level, and a data signal Data is at low level. At this time, the thin film transistor T2, the thin film transistor T4, the thin film transistor T5 and the thin film transistor T6 are in an off state, the thin film transistor T1 and the thin film transistor T7 are in an on state, and an initialization signal Vinit (for example, 0 v) is input to the storage capacitor C and the OLED to initialize both.

In the charging phase t2, the reset signal Reset is at high level, the scan signal Gate is at low level, the enable signal EM is at high level, and the data signal Data is at high level (the data signal Data is higher than the initialization signal Vinit). At this time, the thin film transistor T1, the thin film transistor T5, the thin film transistor T6, and the thin film transistor T7 are in the off state, the thin film transistor T2, the thin film transistor T3 and the thin film transistor T4 are in the on state, and the data signal Data is provided to the storage capacitor C through the thin film transistor T4, the thin film transistor T3 and the thin film transistor T2 sequentially, and the storage capacitor C is charged.

In the light-emitting phase t3, the reset signal Reset is at high level, the scan signal Gate is at high level, the enable signal EM is at low level, and the data signal Data is at low level. At this time, the thin film transistor T1, the thin film transistor T2, the thin film transistor T4 and the thin film transistor T7 are in the off state, the thin film transistor T3, the thin film transistor T5 and the thin film transistor T6 are in the on state, and a voltage signal $V_{DD}$ is provided to the OLED through the thin film transistor T5, the thin film transistor T3 and the thin film transistor T6 sequentially, so as to make the OLED emit light.

Figure 4:
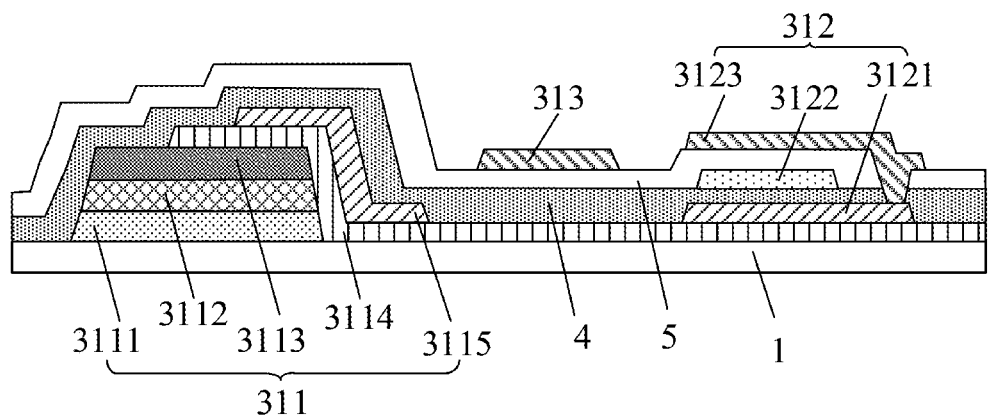
FIG. 4 is a schematic diagram showing a structure of another display substrate, according to some embodiments of the present disclosure.
Figure 5:
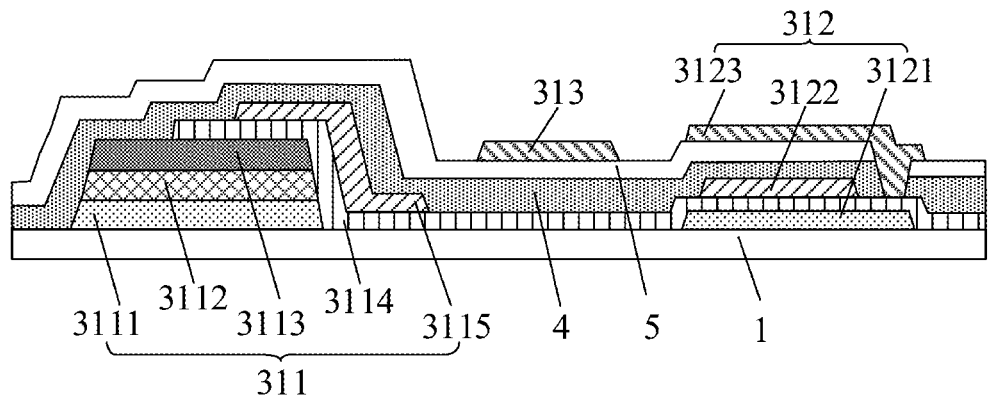
FIG. 5 is a schematic diagram showing a structure of yet another display substrate, according to some embodiments of the present disclosure.
Figure 6:
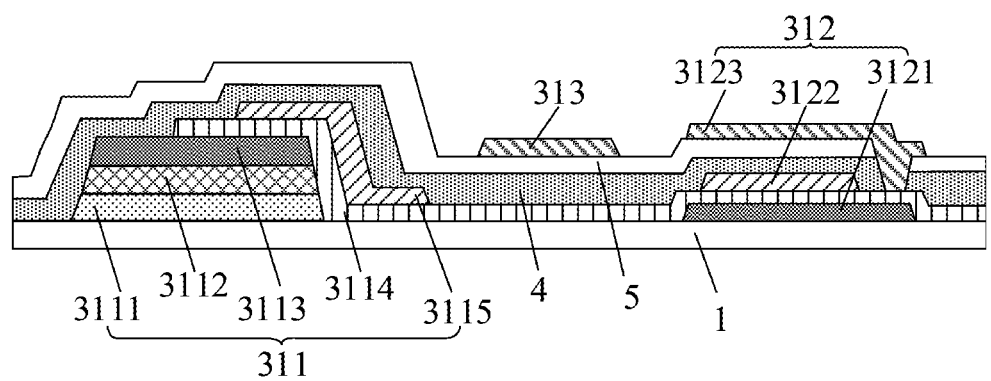
FIG. 6 is a schematic diagram showing a structure of yet another display substrate, according to some embodiments of the present disclosure.

In some embodiments of the present disclosure, at least one of the plurality of thin film transistors in each pixel driving circuit 31 is provided as the vertical thin film transistor 311. Referring to FIGS. 4 to 6, each of the at least one vertical thin film transistor 311 includes a first electrode 3111, a vertical active layer 3112 and a second electrode 3113 that are sequentially stacked on top of one another.

The vertical active layer 3112 refers to an active layer having a vertical conductive channel, and the vertical conductive channel is perpendicular (or substantially perpendicular) to the surface of the base 1. In some examples, considering an actual manufacturing process of the vertical active layer 3112, the vertical active layer 3112 generally has a trapezoidal structure. That is, ends of the vertical active layer 3112 are not completely perpendicular to the surface of the base 1, and the vertical conductive channel is substantially perpendicular to the surface of the base 1.

The categories of the first electrode 3111 and the second electrode 3113 are arranged correspondingly. In some examples, the first electrode 3111 is a source, and correspondingly, the second electrode 3113 is a drain. In some other examples, the first electrode 3111 is a drain, and correspondingly, the second electrode 3113 is a source.

The thin film transistor(s) of the plurality of thin film transistors in each pixel driving circuit 31 in addition to the at least one vertical thin film transistor 311 are horizontal thin film transistor(s). The horizontal thin film transistor includes a source, a horizontal active layer and a drain that are sequentially arranged in a direction parallel (or substantially parallel) to the surface of the base 1. The horizontal active layer has a horizontal conductive channel parallel (or substantially parallel) to the surface of the base 1.

By providing the conductive channel between the first electrode 3111 and the second electrode 3113 in each vertical thin film transistor 311 as the vertical conductive channel, and stacking the first electrode 3111, the vertical active layer 3112 and the second electrode 3113 sequentially in a direction perpendicular to the surface of the base 1, a structure of the vertical thin film transistor 311 may be more compact in comparison with a structure of the horizontal thin film transistor. In this way, it is able to effectively reduce an occupied area of each vertical thin film transistor 311 on the base 1. Herein, the occupied area refers to an area of an orthographic projection of each vertical thin film transistor 311 on the base 1.

Referring to FIGS. 4 to 6, each vertical thin film transistor 311 further includes a gate 3115 corresponding to the vertical active layer 3112. Herein, the gate 3115 is arranged corresponding to the vertical active layer 3112, which is represented as follows: the gate 3115 is arranged opposite to the vertical conductive channel of the vertical active layer 3112.

In some examples, referring to FIGS. 4 to 6, at least a portion of a surface of the second electrode 3113 facing away from the first electrode 3111 is in contact with the gate 3115. That is, at least a portion of an orthographic projection of the second electrode 3113 on the base 1 overlaps with a portion of an orthographic projection of the gate 3115 on the base 1.

Based on that a portion of the gate 3115 is in contact with at least a portion of the surface of the second electrode 3113 facing away from the first electrode 3111, and another portion of the gate 3115 is arranged opposite to the vertical active layer 3112, so that a structure of the gate 3115 has a "Z" shape, which is conducive to improving adhesion between the gate 3115 and a gate insulating layer 3114, and avoiding a case where the gate 3115 detaches from the gate insulating layer 3114. Herein, a contact area between the gate 3115 and the second electrode 3113 is small, thus it may avoid capacitance existing between the gate 3115 and the second electrode 3113.

Herein, each vertical thin film transistor 311 generally further includes the gate insulating layer 3114 disposed on a side of the gate 3115 proximate to the base 1.

In some embodiments, in the main display area A1 of the display substrate 100, each of the plurality of first sub-pixels 2 includes a second pixel driving circuit. The second pixel driving circuit includes a plurality of second thin film transistor. Each of the plurality of second thin film transistors is a horizontal thin film transistor, and a manufacturing process thereof is relatively simple.

In the display substrate 100 provided by some embodiments of the present disclosure, the display area is divided into the main display area A1 and the at least one auxiliary display area A2, the plurality of second thin film transistors in each second pixel driving circuit in the main display area A1 are provided as the horizontal thin film transistors, and at least one thin film transistor in each pixel driving circuit 31 in each auxiliary display area A2 is provided as the vertical thin film transistor 311. It may not only simplify a manufacturing process of the display substrate 100, but also reduce an occupied area of the at least one thin film transistor in each auxiliary display area A2 on the base 1. Therefore, an occupied area of each pixel driving circuit 31 on the base 1 may be reduced, and the space B between every two adjacent pixel driving circuits 31 may be increased. In this way, an area of the light-transmitting region composed of the plurality of spaces B in each auxiliary display area A2 may be effectively increased, and light transmittance of each auxiliary display area A2 may be improved.

Moreover, after the display substrate 100 is applied to the display apparatus 1000, more light from the outside may pass through a portion of the display substrate 100 located in each auxiliary display area A2 to enter the optical device 200; alternatively, light emitted from the optical device 200 may more easily pass through the portion of the display substrate 100 located in each auxiliary display area A2 to enter the outside. Therefore, an influence on normal use of functional devices may be reduced, and use effects of the functional devices may be improved.

Herein, among the plurality of thin film transistors included in each pixel driving circuit 31, the driving transistor is configured to provide driving signals, and each switching transistor is configured to provide switching signals. Based on functions of the driving transistor and each switching transistor themselves, in a case where structures of the driving transistor and each switching transistor are similar, an occupied area of the driving transistor is generally much larger than that of each switching transistor.

In some embodiments, referring to FIG. 2, one of the at least one vertical thin film transistor 311 is the driving transistor T3. That is, the driving transistor T3 in each pixel driving circuit 31 is the vertical thin film Transistor 311.

By providing the driving transistor T3 in the pixel driving circuit 31 as the vertical thin film transistor 311, the occupied area of the pixel driving circuit 31 may be further reduced, which is able to further increase the area of the light-transmitting region in each auxiliary display area A2, and further improve the light transmittance of each auxiliary display area A2.

Herein, the vertical conductive channel in the vertical active layer 3112 in each vertical thin film transistor 311 has a length and a width. The length is a distance between the first electrode 3111 and the second electrode 3113, and the width is a dimension of the vertical conductive channel in a direction perpendicular to the length direction.

In some embodiments, the vertical active layer 3112 of the driving transistor T3 has a first vertical conductive channel. The width of the first vertical conductive channel ranges from 3.0 μm to 4.5 μm, the length of the first vertical conductive channel ranges from 10 μm to 35 μm, and a width-to-length ratio of the first vertical conductive channel ranges from 0.09 to 0.45. In this way, the first vertical conductive channel may have a good conductivity, the driving transistor T3 may provide a large driving voltage to the OLED, and the driving transistor may also be guaranteed to have a small occupied area.

In some other embodiments, in the at least one vertical thin film transistor 311, the vertical active layer 3112 in the vertical thin film transistor 311 in addition to the driving transistor T3 (i.e., the switching transistor) has a second vertical conductive channel. The width of the second vertical conductive channel ranges from 2.0 μm to 4.0 μm, the length of the second vertical conductive channel ranges from 2.0 μm to 4.0 μm, and a width-to-length ratio of the second vertical conductive channel ranges from 0.5 to 2. In this way, the second vertical conductive channel may have a good conductivity, and an occupied area of the switching transistor may be effectively reduced.

In some embodiments, referring to FIGS. 2 to 6, the pixel driving circuit 31 further includes at least one capacitor 312 (the storage capacitor C as shown in FIG. 2). Each of the at least one capacitor 312 includes a first electrode plate 3121, a second electrode plate 3122 and a third electrode plate 3123 that are arranged in parallel in a direction from the first electrode 3111 to the second electrode 3113. The first electrode plate 3121 is electrically connected to the third electrode plate 3123, so that each capacitor 312 includes two sub-capacitors that are connected in parallel.

Herein, capacitance of each capacitor 312 is a sum of capacitance of each of the two sub-capacitors. It should be noted that the capacitance of the capacitor 312 is proportional to a relative area of the electrode plates. In some embodiments of the present disclosure, a structure of each capacitor 312 is provided as the first electrode plate 3121, the second electrode plate 3122 and the third electrode plate 3123 that are arranged in parallel, and the first electrode plate 3121 is electrically connected to the third electrode plate. In this way, the occupied areas of the first electrode plate 3121, the second electrode plate 3122 and the third electrode plate 3123 may be effectively reduced. That is, the occupied area of each capacitor 312 may be reduced. Therefore, the occupied area of each pixel driving circuit 31 may be further reduced, the area of the light-transmitting region of each auxiliary display area A2 may be further increased, and the light transmittance of each auxiliary display area A2 may be further improved.

In an example where the distribution density of the second sub-pixels 3 in each auxiliary display area A2 is 400 pixels per inch (PPI), a schematic description will be given below.

Herein, the capacitance that each capacitor 312 needs to achieve is 0.12 pF. In some embodiments of the present disclosure, a thickness of the gate insulating layer 3114 (a dimension thereof in the direction perpendicular to the base 1) is 1200 Å, and a dielectric constant of the gate insulating layer 3114 is 7.

If a plate capacitor including two opposite electrode plates is used, according to a calculation formula of the plate capacitor: $C=\varepsilon*\varepsilon_0*S/d$, where $\varepsilon$ is the dielectric constant of the gate insulating layer 3114, $\varepsilon_0$ is the dielectric constant of vacuum, $\varepsilon_0$ is $8.86\times10^{-12}$ F/m, S is a relative area of the two electrode plates in the plate capacitor, d is a distance between the two electrode plates, i.e., the thickness of the gate insulating layer 3114, then the relative area of the electrode plates of the plate capacitor is 23.21 $\mu m^2$. If the plate capacitor is replaced with the capacitor 312 in some embodiments of the present disclosure, the relative area of each electrode plate of the capacitor 312 is 15 $\mu m^2$, which is reduced by 35% compared with the plate capacitor.

Therefore, each electrode plate in the capacitor 312 used in some embodiments of the present disclosure has a small relative area, which is able to reduce the occupied area of the capacitor 312, thereby reducing the occupied area of each pixel driving circuit 31, increasing the area of the light transmission region in each auxiliary display area A2, and increasing the light transmittance of each auxiliary display area A2.

In addition, it can be known through conducting experiments on some embodiments of the present disclosure that, by providing the at least one vertical thin film transistor 311 and the at least one capacitor 312 in the pixel driving circuit 31, the occupied area of each pixel driving circuit 31 may be effectively reduced, and the transmittance of each auxiliary display area A2 may be increased 20%.

The arrangement manner of each capacitor 312 may be various, which can be selected according to actual needs. Some embodiments of the present disclosure do not limit this.

In some examples, referring to FIG. 4, the first electrode plate 3121 in each capacitor 312 is arranged in a same layer as the gate 3115 in the pixel driving circuit 31 to which the first electrode plate 3121 belongs.

The same layer arrangement means that the first electrode plate 3121 and the gate 3115 in the pixel driving circuit 31 to which the first electrode plate 3121 belongs are manufactured in a single patterning process by using the same material. The patterning process includes a photolithography process, or a process including a photolithography process and an etching process. The photolithography process refers to a process that includes film formation (e.g., chemical vapor deposition (CVD) film formation), exposure, development, or the like, in which photoresist, mask(s), exposure machine(s), etc. are used to form pattern(s). In this way, it is beneficial to simplify the manufacturing process of the display substrate 100 and improve a manufacturing efficiency of the display substrate 100.

Herein, a connection relationship between the first electrode plate 3121 and the gate 3115 is related to a structure of the pixel drive circuit 31 to which they belong. For example, the pixel driving circuit 31 adopts a structure as shown in FIG. 2. The first electrode plate 3121 belongs to the storage capacitor C, and the gate 3115 belongs to the driving transistor T3, then the first electrode plate 3121 is electrically connected to the gate 3115. The first electrode plate 3121 belongs to the storage capacitor C, and the gate 3115 belongs to the thin film transistor in addition to the driving transistor T3 (for example, one of T1, T2, and T4 to T7), then the first electrode plate 3121 is insulated from the gate 3115.

In some other examples, referring to FIG. 5, the first electrode plate 3121 in each capacitor 312 is arranged in a same layer as the first electrode 3111 in the pixel driving circuit 31 to which the first electrode plate 3121 belongs. The second electrode plate 3122 is arranged in a same layer as the gate 3115 in the pixel driving circuit 31 to which the second electrode plate 3122 belongs.

Herein, a connection relationship between the first electrode plate 3121 and the first electrode 3111 and a connection relationship between the second electrode plate 3122 and the gate 3115 are related to a structure of the pixel drive circuit 31 to which they belong. The connection relationship between the first electrode plate 3121 and the first electrode 3111 may refer to a connection relationship as shown in FIG. 2. The connection relationship between the second electrode plate 3122 and the gate 3115 may refer to the connection relationship between the first electrode plate 3121 and the gate 3115 in some examples described above.

In some other examples, referring to FIG. 6, the first electrode plate 3121 in each capacitor 312 is arranged in a same layer as the second electrode 3113 in the pixel driving circuit 31 to which the first electrode plate 3121 belongs. The second electrode plate 3122 is arranged in a same layer as the gate 3115 in the pixel driving circuit 31 to which the second electrode plate 3122 belongs.

Herein, a connection relationship between the first electrode plate 3121 and the second electrode 3113 and a connection relationship between the second electrode plate 3122 and the gate 3115 are related to a structure of the pixel drive circuit 31 to which they belong. The connection relationship between the first electrode plate 3121 and the second electrode 3113 may refer to the connection relationship as shown in FIG. 2. The connection relationship between the second electrode plate 3122 and the gate 3115 may refer to the connection relationship between the first electrode plate 3121 and the gate 3115 in some examples described above.

In some embodiments, referring to FIGS. 4 to 6, each second sub-pixel 3 further includes a pixel electrode 313 electrically connected to the pixel driving circuit 31. The pixel electrode 313 is generally electrically connected to the driving transistor in the pixel driving circuit 31.

The pixel electrode 313 and the third electrode plate 3123 in the capacitor 312 are arranged in a same layer, and the two are insulated from each other.

A structure of the pixel electrode 313 is related to the type of the display apparatus 1000 to which the display substrate 100 belongs.

For example, the display device 1000 is the OLED display apparatus, and the pixel electrode 313 is an anode of the OLED. For example, the display apparatus 1000 is the Mini LED display apparatus or the Micro LED display apparatus, and the pixel electrode 313 is a driving electrode for driving the corresponding Mini LED or Micro LED to emit light. For example, the display apparatus 1000 is the LCD apparatus, and the pixel electrode 313 is a pixel electrode for driving liquid crystal molecules to rotate.

Figure 7:
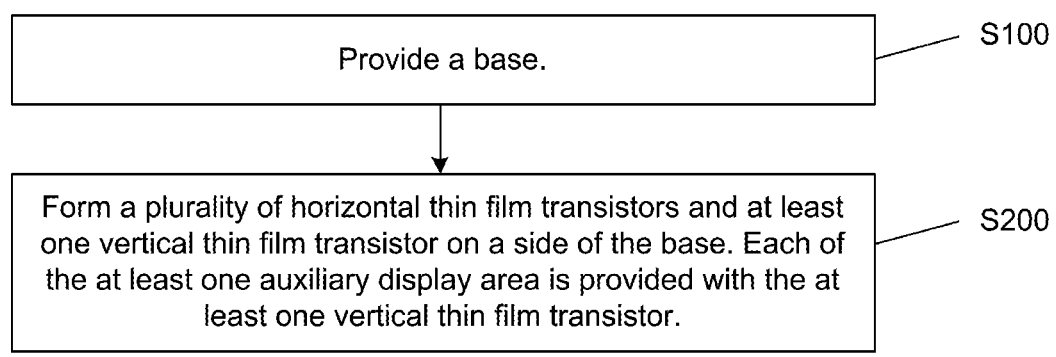
FIG. 7 is a flow chart of a method for manufacturing a display substrate, according to some embodiments of the present disclosure.
Figure 8:
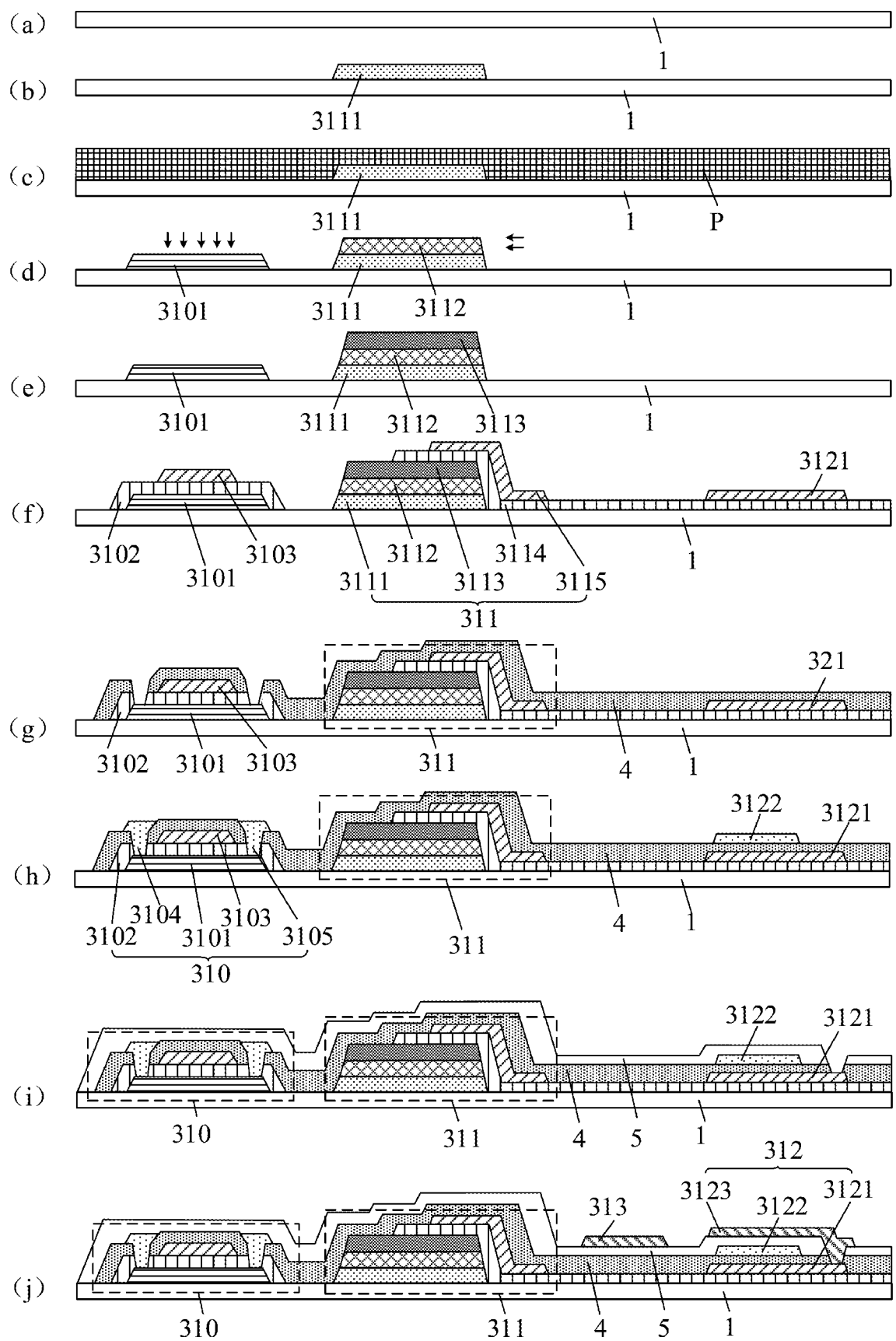
FIG. 8 is a flow chart of manufacturing a display substrate, according to some embodiments of the present disclosure.

Some embodiments of the present disclosure provide a method for manufacturing a display substrate, which is used to manufacture the display substrate 100 provided by some embodiments described above. Referring to FIGS. 1, 7 and 8, the method for manufacturing the display substrate includes S100 to S200.

In S100, as shown in part (a) of FIG. 8, a base 1 is provided.

The display substrate 100 has a main display area A1 and at least one auxiliary display area A2 located beside the main display area A1. That is, the base 1 includes a portion located in the main display area A1 and a portion located in the at least one auxiliary display area A2.

The type of the base 1 includes various types, and the type of the base 1 may be selected according to actual needs, which is not limited in some embodiments of the present disclosure. In some examples, the base 1 includes a rigid base, such as a glass base. In some other examples, the base 1 includes a flexible base, such as a polyethylene terephthalate (PET) base, a polyethylene naphthalate two formic acid glycol ester (PEN) base, or a polyimide (PI) base.

In S200, as shown in part (i) of FIG. 8, a plurality of horizontal thin film transistors 310 and at least one vertical thin film transistor 311 are formed on a side of the base 1. At least one vertical thin film transistor 311 is located in each of the at least one auxiliary display area A2.

Herein, the at least one vertical thin film transistor 311 includes one vertical thin film transistor 311, and then the at least one auxiliary display area A2 includes one auxiliary display area A2. The at least one vertical thin film transistor 311 includes at least two vertical thin film transistors 311, then the at least one auxiliary display area A2 includes at least two auxiliary display areas A2, and each auxiliary display area A2 is provided with at least one vertical thin film transistor 311.

Arrangement positions of the plurality of horizontal thin film transistors 310 are related to the number of the vertical thin film transistors 311 in each auxiliary display area A2. For example, all the thin film transistors provided in each auxiliary display area A2 are vertical thin film transistors 311, then the plurality of horizontal thin film transistors 310 are all located in the main display area A1. Some of the thin film transistors provided in each auxiliary display area A2 is the vertical thin film transistor(s) 311, then some of the plurality of horizontal thin film transistors 310 is located in the main display area A1, and the rest is located in each auxiliary display area A2.

Beneficial effects that may be achieved by the method for manufacturing the display substrate provided in some embodiments of the present disclosure are the same as the beneficial effects that may be achieved by the display substrate 100 provided in some embodiments described above, which will not repeated herein.

In some embodiments, referring to FIG. 8, in the S200, the step of forming a plurality of horizontal thin film transistors 310 and at least one vertical thin film transistor 311 on a side of the base 1 includes S210 to S230.

In S210, as shown in part (b) of FIG. 8, at least one first electrode 3111 is formed on a side of the portion of the base 1 located in each auxiliary display area A2.

For example, the at least one first electrode 3111 is formed by using a photolithography process.

The type of each of the at least one first electrode 3111 can be selected according to actual needs, which is not limited in some embodiments of the present disclosure. For example, each first electrode 3111 is a source or a drain.

In S220, as shown in part (c) and part (d) of FIG. 8, a polysilicon film P is formed on a side of the at least one first electrode 3111 away from the base 1.

For example, the polysilicon film P may be manufactured and formed through a plasma enhanced chemical vapor deposition (PECVD) process.

In S230, as shown in part (d) of FIG. 8, the polysilicon film P is patterned to form a plurality of polysilicon layers, and the plurality of polysilicon layers are doped to form a plurality of horizontal active layers 3101 and at least one vertical active layer 3112. The plurality of horizontal active layers 3101 and the at least one vertical active layer 3112 are formed in a single doping process.

For example, a photolithography process is used to pattern the polysilicon film P to form the plurality polysilicon layers. The plurality of polysilicon layers include a portion located on a side of each first electrode 3111 away from the base 1, and a portion located on the side of the base 1 (that is, the first electrode 3111 is not provided between this portion and the base 1). Of the plurality of polysilicon layers, the portion located on the side of each first electrode 3111 away from the base 1 correspondingly forms the at least one vertical active layer 3112, and the portion located on the side of the base 1 correspondingly forms the plurality of horizontal active layers 3101.

The plurality of horizontal active layers 3101 and the at least one vertical active layer 3112 are formed in the single doping process, which means that: in a single ion implantation process, in a direction perpendicular to the base 1, a surface of the portion of the plurality of polysilicon layers located on the side of the base 1 is ion-doped, and simultaneously, in a direction parallel to the base 1, a side face of the portion of the plurality of polysilicon layers located on the side of each first electrode 3111 away from the base 1 is ion-doped, so that the plurality of horizontal active layers 3101 and the at least one vertical active layer 3112 are synchronously formed.

For example, the single doping process is implemented by using an ion implantation device.

In some embodiments of the present disclosure, by forming the plurality of horizontal active layers 3101 and the at least one vertical active layer 3112 synchronously in a single doping process, it may be avoided that the plurality of horizontal active layers 3101 and the at least one vertical active layer 3112 are respectively formed in two doping processes. Therefore, the manufacturing process of the display substrate 100 may be effectively simplified, and the manufacturing efficiency of the display substrate 100 may be improved.

In some embodiments, referring to FIG. 8, in the S200, the step of forming the at least one vertical thin film transistor 311 further includes S240 and S250.

In S240, as shown in part (e) of FIG. 8, a second electrode 3113 is formed on a side of each of the at least one vertical active layer 3112 away from the base 1.

A type of the second electrode 3113 corresponds to the type of the first electrode 3111. For example, the first electrode 3111 is a source, and the second electrode 3113 is a drain. Alternatively, the first electrode 3111 is a drain, and the second electrode 3113 is a source.

In S250, as shown in part (f) of FIG. 8, a metal film is formed at a side of the second electrode 3113 away from the base 1, and the metal film is patterned to form a gate 3115. The gate 3115 is arranged corresponding to the corresponding vertical active layer 3112.

For example, the metal film is manufactured and formed by using metal materials (such as aluminum (Al), copper (Cu), molybdenum (Mo), titanium (Ti), or gold (Au)) through a magnetron sputtering process or an evaporation process. The metal film is patterned by using a photolithography process.

Herein, after the metal film is patterned, the gate 3115 is formed, and simultaneously, a second gate 3103 is formed at a side of each of the plurality of horizontal active layers 3101 away from the base 1.

In addition, as shown in part (f) of FIG. 8, before the S250, a gate insulating layer 3114 is formed between the gate 3115 and the second electrode 3113, and a second gate insulating layer 3102 is formed between the second gate 3103 and the horizontal active layer 3101. The gate insulating layer 3114 and the second gate insulating layer 3102 are arranged in a same layer. That is, the two are manufactured and formed by using the same material in a single patterning process.

In some embodiments, after the S250, in the S200, the step of forming the plurality of horizontal thin film transistors 310 further includes S260 and S270.

In S260, as shown in part (g) of FIG. 8, an interlayer insulating layer 4 is formed on a side of the gate 3115 away from the base 1 and on a side of the second gate 3103 away from the base 1, and two first via holes are formed. Each first via hole passes through a portion of the interlayer insulating layer 4 and a portion of the second gate insulating layer 3102 that are corresponding to the horizontal active layer 3101, and a surface of the horizontal active layer 3101 is exposed.

In S270, as shown in part (h) of FIG. 8, a source 3104 and a drain 3105 of the horizontal thin film transistor 310 are formed. The source 3104 and the drain 3105 are electrically connected to the surface of the horizontal active layer 3101 through the corresponding first via holes, respectively.

In some embodiments, the method for manufacturing the display substrate further includes S300.

In S300, at least one capacitor 312 is formed in each auxiliary display area A2. Each of the at least one capacitor 312 includes a first electrode plate 3121, a second electrode plate 3122 and a third electrode plate 3123 that are arranged in parallel in a direction from each first electrode 3111 to the corresponding second electrode 3113. The first electrode plate 3121 is electrically connected to the third electrode plate 3123.

In some embodiments, in the S300, the step of forming the at least one capacitor 312 in each auxiliary display area A2 includes S250a, S270a, S301a and S302a.

In S250a, as shown in part (f) of FIG. 8, a metal film is formed at a side of the second electrode 3113 away from the base 1, and the metal film is patterned to form a gate 3115 and at least one first electrode plate 3121.

In S270a, as shown in part (h) of FIG. 8, a source 3104 and a drain 3105 of the horizontal thin film transistor 310 are formed, and simultaneously, the second electrode plate 3122 is formed. That is, the second electrode plate 3122, the source 3104 and the drain 3105 are arranged in a same layer, and are manufactured and formed by using the same material in a single patterning process.

In S301a, as shown in part (i) of FIG. 8, a passivation layer 5 is formed on a side of the second electrode plate 3122 away from the base 1, and a second via hole is formed. The second via hole passes through a portion of the passivation layer 5 and a portion of the interlayer insulating layer 4 that are corresponding to the first electrode plate 3121, and a surface of the first electrode plate 3121 is exposed.

In S302a, as shown in part (j) of FIG. 8, the third electrode plate 3123 is formed on a side of the passivation layer 5 away from the base 1. The third electrode plate 3123 is electrically connected to the corresponding first electrode plate 3121 through the second via hole. In addition, in a process of forming the third electrode plate 3123, a pixel electrode 313 arranged in a same layer as the third electrode plate 3123 is also formed. That is, the two are manufactured and formed by using the same material in a single patterning process.

In some other embodiments, in the S300, the step of forming the at least one capacitor 312 in each auxiliary display area A2 includes S210b, S250b, S301b and S302b.

Figure 9:
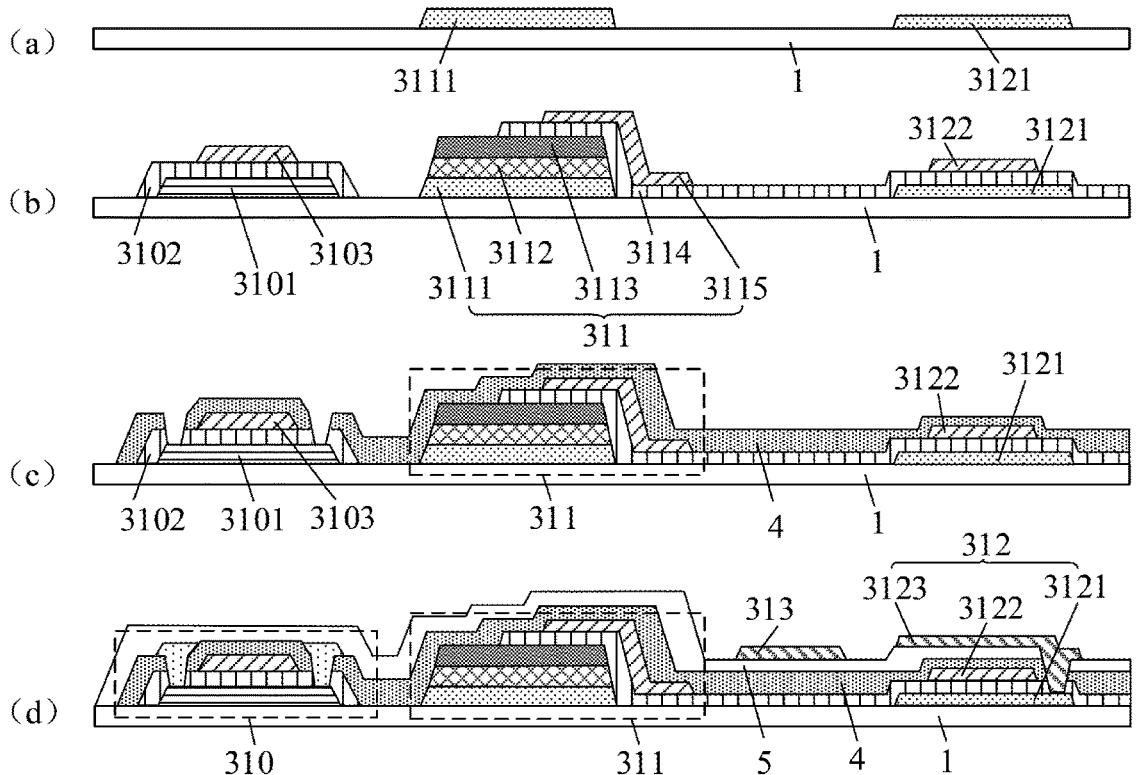
FIG. 9 is a flow chart of manufacturing another display substrate, according to some embodiments of the present disclosure.

In S210b, as shown in part (b) of FIG. 8 and part (a) of FIG. 9, at least one first electrode 3111 and at least one first electrode plate 3121 are formed on a side of the portion of the base 1 located in each auxiliary display area A2. That is, the at least one first electrode plate 3121 and the at least one first electrode 3111 are arranged in a same layer, and are manufactured and formed by using the same material in a single patterning process.

In S250b, as shown in part (f) of FIG. 8 and part (b) of FIG. 9, a metal film is formed at a side of the second electrode 3113 away from the base 1, and the metal film is patterned to form a gate 3115 and at least one second electrode plate 3122. That is, the at least one second electrode plate 3122 and the gate 3115 are formed by patterning the same metal film.

In S301b, as shown in part (c) of FIG. 9, an interlayer insulating layer 4 is formed on a side of the second electrode plate 3122 away from the base 1.

In S302b, as shown in part (d) of FIG. 9, a passivation layer 5 is formed on a side of the interlayer insulating layer 4 away from the base 1, and a third via hole is formed. The third via hole passes through a portion of the passivation layer 5, a portion of the interlayer insulating layer 4 and a portion of the gate insulating layer 3114 that are corresponding to the first electrode plate 3121, and a surface of the first electrode plate 3121 is exposed.

The third electrode plate 3123 is formed on a side of the passivation layer 5 away from the base 1. The third electrode plate 3123 is electrically connected to the corresponding first electrode plate 3121 through the third via hole. In addition, in a process of forming the third electrode plate 3123, a pixel electrode 313 arranged in a same layer as the third electrode plate 3123 is also formed. That is, the two are manufactured and formed by using the same material in a single patterning process.

In some other embodiments, in S300, the step of forming the at least one capacitor 312 in each auxiliary display area A2 includes S240c, S250c, S301c and S302c.

Figure 10:
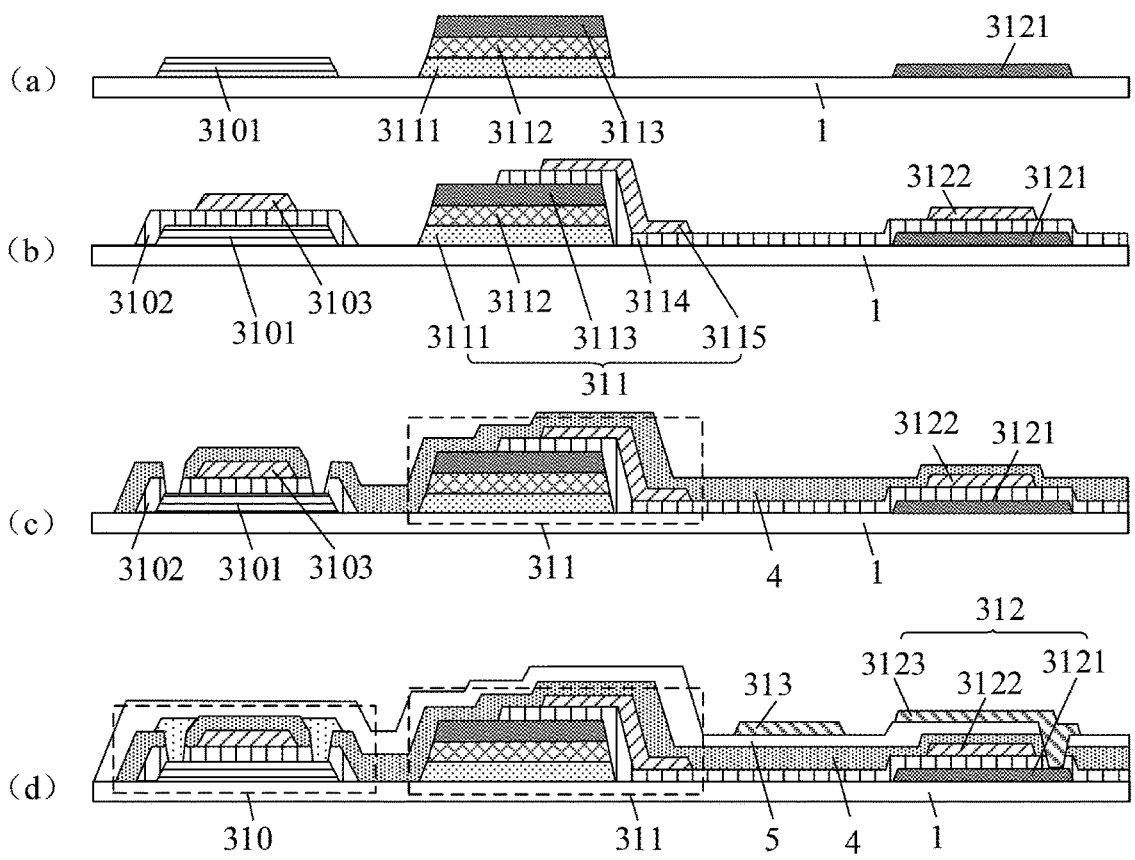
FIG. 10 is a flow chart of manufacturing yet another display substrate, according to some embodiments of the present disclosure.

In S240c, as shown in part (e) of FIG. 8 and part (a) of FIG. 10, a second electrode 3113 is formed on a side of each of the at least one vertical active layer 3112 away from the base 1 and at least one first electrode plate 3121 is also formed. That is, the at least one first electrode plate 3121 and the at least one second electrode 3113 are arranged in a same layer.

In S250c, as shown in part (f) of FIG. 8 and part (b) of FIG. 10, a metal film is formed at a side of the second electrode 3113 away from the base 1, and the metal film is patterned to form a gate 3115 and at least one second electrode plate 3122. That is, the at least one second electrode plate 3122 and the gate 3115 are formed by patterning the same metal film.

In S301c, as shown in part (c) of FIG. 10, a manufacturing method of this step is the same as that of S301b, which will not be repeated herein.

In S302c, as shown in part (d) of FIG. 10, a manufacturing method of this step is the same as that of S302b, which will not be repeated herein.

Some embodiments of the present disclosure provide a display apparatus 1000. Referring to FIGS. 11 and 12, the display apparatus 1000 includes the display substrate 100 in some embodiments described above. The display substrate 100 in the display apparatus 1000 has the same technical effects as the display substrate 100 in some of the foregoing embodiments, which will not be repeated herein.

In some embodiments, referring to FIG. 11, the display apparatus 1000 further includes at least one optical device 200. Each of the at least one optical device 200 corresponds to the light-transmitting region of one auxiliary display area of the display substrate 100. That is, an orthographic projection of each optical device 200 on the display substrate 100 is within a range of the corresponding auxiliary display area.

The type of the optical device 200 is various.

In some examples, the optical device 200 includes a camera, an infrared receiver, or the like. Each optical device 200 is able to collect light passing through the corresponding light-transmitting region. That is, light at the display side is able to travel to the corresponding optical device 200 through the corresponding light-transmitting region, so that the corresponding optical device 200 is able to collect light and perform corresponding work.

In some other examples, the optical device 200 includes an infrared emitter. At this time, light emitted from each optical device 200 is able to pass through the corresponding light-transmitting region. That is, light emitted from the optical device 200 is able to travel to the display side through the light-transmitting region, which is associated with the object (such as a human face or a device that may interact with the display apparatus) located at the display side.

In some examples, the display apparatus 1000 is a product or component having a display function such as a mobile phone, a tablet computer, a notebook computer, or a display.

In the description of the above embodiments, the specific feature, structure, material or characteristic may be combined in any suitable manner in any one or more embodiments or examples.

The foregoing descriptions are merely some implementation manners of the present disclosure, but the protection scope of the present disclosure is not limited thereto. The protection scope of the present disclosure shall be subject to the protection scope of the claims.

What is claimed is:

1. A display substrate having a main display area and at least one auxiliary display area located beside the main display area, comprising:
 a plurality of first sub-pixels located in the main display area, and
 a plurality of second sub-pixels located in each of the at least one auxiliary display area; wherein
 a distribution density of the plurality of first sub-pixels in the main display area is greater than a distribution density of the plurality of second sub-pixels in each auxiliary display area;
 each of the plurality of second sub-pixels includes a pixel driving circuit, and the pixel driving circuit includes at least one vertical thin film transistor and at least one capacitor; and
 a space exists between every two adjacent pixel driving circuits, and a plurality of spaces constitute a light-transmitting region of a corresponding auxiliary display area,
 wherein each of the at least one vertical thin film transistor includes a first electrode, a vertical active layer and a second electrode that are sequentially stacked on top of one another, and a gate arranged corresponding to the vertical active layer, and
 each of the at least one capacitor includes a first electrode plate, a second electrode plate and a third electrode plate that are arranged in parallel in a direction from the first electrode to the second electrode; and the first electrode plate is electrically connected to the third electrode plate, wherein
 the first electrode plate is arranged in a same layer as the gate in the pixel driving circuit to which the first electrode plate belongs; or
 the first electrode plate is arranged in a same layer as the first electrode in the pixel driving circuit to which the first electrode plate belongs; and the second electrode plate is arranged in a same layer as the gate in the pixel driving circuit to which the second electrode plate belongs; or
 the first electrode plate is arranged in a same layer as the second electrode in the pixel driving circuit to which the first electrode plate belongs; and the second electrode plate is arranged in a same layer as the gate in the pixel driving circuit to which the second electrode plate belongs.

2. The display substrate according to claim 1, further comprising a base, wherein the plurality of first sub-pixels and the plurality of second sub-pixels are disposed on the base, and at least a portion of an orthographic projection of the second electrode on the base overlaps with a portion of an orthographic projection of the gate on the base.

3. The display substrate according to claim 1, wherein each second sub-pixel further includes a pixel electrode electrically connected to the pixel driving circuit; and
 the pixel electrode is arranged in a same layer as the third electrode plate.

4. The display substrate according to claim 1, wherein one of the at least one vertical thin film transistor is a driving transistor.

5. The display substrate according to claim 4, wherein the vertical active layer of the driving transistor has a first vertical conductive channel; a width of the first vertical conductive channel ranges from 3.0 μm to 4.5 μm, a length of the first vertical conductive channel ranges from 10 μm to 35 μm, and a width-to-length ratio of the first vertical conductive channel ranges from 0.09 to 0.45.

6. The display substrate according to claim 4, wherein the vertical active layer of each of the at least one vertical thin film transistor in addition to the driving transistor has a second vertical conductive channel; a width of the second vertical conductive channel ranges from 2.0 μm to 4.0 μm, a length of the second vertical conductive channel ranges from 2.0 μm to 4.0 μm, and a width-to-length ratio of the second vertical conductive channel ranges from 0.5 to 2.

7. A display apparatus, comprising the display substrate according to claim 1.

8. The method according to claim 7, further comprising: at least one optical device, and each of the at least one optical device corresponding to the light-transmitting region of one auxiliary display area of the display substrate; wherein each optical device is able to collect light passing through the corresponding light-transmitting region; or light emitted from each optical device is able to pass through the corresponding light-transmitting region.

9. A method for manufacturing a display substrate, the display substrate having a main display area and at least one auxiliary display area located beside the main display area; the method comprising:

providing a base; and forming a plurality of horizontal thin film transistors and at least one vertical thin film transistor on a side of the base; wherein each of the at least one auxiliary display area is provided with the at least one vertical thin film transistor, wherein forming a plurality of horizontal thin film transistors and at least one vertical thin film transistor on a side of the base, includes:

forming at least one first electrode on a side of a portion of the base located in each auxiliary display area;

forming a polysilicon film on a side of the at least one first electrode away from the base;

patterning the polysilicon film to form a plurality of polysilicon layers; and doping the plurality of polysilicon layers to form a plurality of horizontal active layers and at least one vertical active layer, wherein the plurality of horizontal active layers and the at least one vertical active layer are formed in a single doping process.

10. The method according to claim 9, wherein forming at least one vertical thin film transistor, further includes:

forming a second electrode on a side of each of the at least one vertical active layer away from the base; and forming a metal film at a side of the second electrode away from the base, and patterning the metal film to form a gate; wherein the gate is arranged corresponding to the corresponding vertical active layer.

11. The method according to claim 10, further comprising:

forming at least one capacitor in each auxiliary display area; wherein each of the at least one capacitor includes a first electrode plate, a second electrode plate and a third electrode plate that are arranged in parallel in a direction from each of the at least one first electrode to the corresponding second electrode; and the first electrode plate is electrically connected to the third electrode plate; wherein forming a metal film at a side of the second electrode away from the base, and patterning the metal film to form a gate, further includes: forming at least one first electrode plate;

or, forming at least one first electrode on a side of a portion of the base located in each auxiliary display area, further includes: forming at least one first electrode plate; and forming a metal film at a side of the second electrode away from the base, and patterning the metal film to form a gate, further includes: forming at least one second electrode plate;

or, forming a second electrode on a side of each of the at least one vertical active layer away from the base, further includes: forming at least one first electrode plate; and forming a metal film at a side of the second electrode away from the base, and patterning the metal film to form a gate, further includes: forming at least one second electrode plate.

* * * * *

UNITED STATES PATENT AND TRADEMARK OFFICE
CERTIFICATE OF CORRECTION

PATENT NO. : 11,735,605 B2  
APPLICATION NO. : 17/042847  
DATED : August 22, 2023  
INVENTOR(S) : Bo Wang, Hao Zhang and Fuqiang Li Page 1 of 1

It is certified that error appears in the above-identified patent and that said Letters Patent is hereby corrected as shown below:

In the Claims

In Column 16, Line 63, delete "method" and insert --display apparatus--

Signed and Sealed this  
First Day of July, 2025

Coke Morgan Stewart  
*Acting Director of the United States Patent and Trademark Office*